(12) United States Patent
Beizaee et al.

(10) Patent No.: US 11,848,595 B2
(45) Date of Patent: Dec. 19, 2023

(54) CHANNEL SEGMENT FOR A TRACK OF A MOVER DEVICE

(71) Applicant: HYPERLOOP TECHNOLOGIES, INC., Los Angeles, CA (US)

(72) Inventors: Shahriyar Beizaee, Los Angeles, CA (US); Rachel Ozer, Los Angeles, CA (US); Alexander Jedinger, Los Angeles, CA (US); Jett Ferm, Los Angeles, CA (US); Richard Parks, Los Angeles, CA (US); Arbi Gharakhani Siraki, Los Angeles, CA (US); Ju Hyung Kim, Los Angeles, CA (US); Tim Lambert, Los Angeles, CA (US); Sushant Chavan, Los Angeles, CA (US)

(73) Assignee: HYPERLOOP TECHNOLOGIES, INC., Los Angeles, CA (US)

( * ) Notice: Subject to any disclaimer, the term of this patent is extended or adjusted under 35 U.S.C. 154(b) by 0 days.

(21) Appl. No.: 17/773,870

(22) PCT Filed: Nov. 5, 2020

(86) PCT No.: PCT/US2020/059010
§ 371 (c)(1),
(2) Date: May 3, 2022

(87) PCT Pub. No.: WO2021/092104
PCT Pub. Date: May 14, 2021

(65) Prior Publication Data
US 2022/0345020 A1 Oct. 27, 2022

Related U.S. Application Data

(60) Provisional application No. 62/945,978, filed on Dec. 10, 2019, provisional application No. 62/931,935,
(Continued)

(51) Int. Cl.
*H02K 41/03* (2006.01)
*H02K 1/14* (2006.01)
(Continued)

(52) U.S. Cl.
CPC ............. *H02K 41/03* (2013.01); *H01F 7/064* (2013.01); *H01F 7/081* (2013.01); *H01F 27/28* (2013.01);
(Continued)

(58) Field of Classification Search
CPC .... H01F 2007/086; H01F 27/28; H01F 7/064; H01F 7/081; Y02T 10/64; Y02T 10/72;
(Continued)

(56) References Cited

U.S. PATENT DOCUMENTS

| | | | |
|---|---|---|---|
| 893,711 A * | 7/1908 | Cushman | ............... H02K 1/148 310/216.127 |
| 4,544,856 A | 10/1985 | King | |

(Continued)

FOREIGN PATENT DOCUMENTS

| | | |
|---|---|---|
| CA | 2567523 A1 * | 12/2005 |
| DE | 19732564 A1 | 2/1999 |

(Continued)

OTHER PUBLICATIONS

CA-2567523-A1, Ahmed, All pages (Year: 2005).*
(Continued)

*Primary Examiner* — Naishadh N Desai
(74) *Attorney, Agent, or Firm* — SEYFARTH SHAW LLP

(57) ABSTRACT

A channel segment for a track of a mover device is provided, the channel segment comprising: opposite ends joined by a body forming a magnetic flux pathway between the opposite ends, the magnetic flux pathway being one or more of C-shaped, U-shaped and horseshoe shaped between the opposite ends, the opposite ends forming respective trans-
(Continued)

verse magnetic flux pathways about perpendicular to the magnetic flux pathway; laminations of ferromagnetic material forming the body, the laminations about parallel to the magnetic flux pathway and about perpendicular to the respective transverse magnetic flux pathways; shear pins through the laminations, the shear pins positioned to reduce eddy currents one or more of in and around the shear pins; and a retention mechanism at the opposite ends, the retention mechanism configured to transversely fasten the laminations together at the opposite ends while remaining insulated from each other.

17 Claims, 9 Drawing Sheets

Related U.S. Application Data filed on Nov. 7, 2019, provisional application No. 62/931,987, filed on Nov. 7, 2019, provisional application No. 62/932,113, filed on Nov. 7, 2019, provisional application No. 62/932,013, filed on Nov. 7, 2019, provisional application No. 62/932,077, filed on Nov. 7, 2019.

(51) Int. Cl.
| | | |
|---|---|---|
| *H02K 9/22* | (2006.01) | |
| *H02K 1/18* | (2006.01) | |
| *H02K 1/20* | (2006.01) | |
| *H02K 5/22* | (2006.01) | |
| *H05K 7/20* | (2006.01) | |
| *H01F 7/06* | (2006.01) | |
| *H01F 7/08* | (2006.01) | |
| *H01F 27/28* | (2006.01) | |
| *H02K 11/21* | (2016.01) | |
| *H02K 11/25* | (2016.01) | |
| *H02K 41/025* | (2006.01) | |
| *H02K 49/04* | (2006.01) | |
| *H02K 3/04* | (2006.01) | |
| *H02K 7/10* | (2006.01) | |

(52) U.S. Cl.
CPC .............. *H02K 1/14* (2013.01); *H02K 1/143* (2013.01); *H02K 1/18* (2013.01); *H02K 1/20* (2013.01); *H02K 3/04* (2013.01); *H02K 5/225* (2013.01); *H02K 9/227* (2021.01); *H02K 11/21* (2016.01); *H02K 11/25* (2016.01); *H02K 41/025* (2013.01); *H02K 41/031* (2013.01); *H02K 49/046* (2013.01); *H05K 7/20254* (2013.01); *H01F 2007/086* (2013.01); *H02K 7/10* (2013.01); *H02K 2201/15* (2013.01); *H02K 2213/12* (2013.01)

(58) Field of Classification Search
CPC .............. H02K 1/143; H02K 2201/15; H02K 2213/12; H02K 41/03; H02K 1/14; H02K 1/141; H02K 1/148; H02K 1/18; H02K 1/185; H02K 1/20; H02K 11/21; H02K 11/25; H02K 11/40; H02K 15/022; H02K 2201/12; H02K 3/04; H02K 3/18; H02K 3/40; H02K 3/52; H02K 41/025; H02K 41/031; H02K 49/046; H02K 5/225; H02K 7/10; H02K 7/104; H02K 9/227; B60L 13/03; B60L 15/2009; B60L 7/28

See application file for complete search history.

(56) References Cited

U.S. PATENT DOCUMENTS

| | | | |
|---|---|---|---|
| 4,689,529 A | 8/1987 | Higuichi | |
| 4,788,477 A | 11/1988 | Teramachi et al. | |
| 5,289,088 A * | 2/1994 | Andoh | ...................... H02K 3/52 |
| 5,868,077 A | 2/1999 | Kuznetsov | |
| 6,522,035 B1 * | 2/2003 | Smit | ...................... H02K 41/03 |
| | | | 310/12.22 |
| 6,741,010 B2 * | 5/2004 | Wilkin | ...................... H02K 1/30 |
| | | | 310/156.19 |
| 2002/0053835 A1 * | 5/2002 | Joong | .................. H02K 41/031 |
| | | | 310/12.21 |
| 2002/0081528 A1 | 6/2002 | Miyajima et al. | |
| 2005/0029874 A1 | 2/2005 | Dadd | |
| 2006/0131967 A1 | 6/2006 | Lin et al. | |
| 2012/0249991 A1 | 10/2012 | Hol et al. | |
| 2013/0015725 A1 | 1/2013 | Trammell | |
| 2013/0113320 A1 * | 5/2013 | Calley | .................... H02K 1/145 |
| | | | 310/216.061 |
| 2015/0091393 A1 | 4/2015 | Hayner et al. | |
| 2015/0171706 A1 | 6/2015 | Dadd | |
| 2018/0131258 A1 | 5/2018 | Dawidowicz | |

FOREIGN PATENT DOCUMENTS

| | | |
|---|---|---|
| DE | 102006027819 A1 | 12/2007 |
| EP | 0093547 A1 | 11/1983 |
| EP | 1213819 A2 | 6/2002 |
| EP | 1511164 A2 | 3/2005 |
| EP | 1544980 A1 | 6/2005 |
| EP | 2876783 A1 | 5/2015 |
| EP | 3107195 A1 | 12/2016 |
| EP | 3258131 A1 | 12/2017 |
| FR | 1165541 A1 | 10/1958 |
| FR | 2526570 A1 | 11/1983 |
| JP | S586055 A | 1/1983 |
| JP | S5886859 A | 5/1983 |
| JP | S6098864 A | 6/1985 |
| WO | 03105317 A1 | 12/2003 |
| WO | 2008142001 A2 | 11/2008 |

OTHER PUBLICATIONS

"International Search Report" dated Mar. 1, 2021, issued in corresponding PCT Application No. PCT/US2020/059010, Filed Nov. 5, 2020.
"International Search Report" dated Feb. 15, 2021, issued in corresponding PCT Application No. PCT/US2020/059012, Filed Nov. 5, 2020.
Molnar, Sabinus, "International Search Report" dated Feb. 23, 2021, issued in corresponding PCT Application No. PCT/US2020/059017, Filed Nov. 5, 2020.
Molnar, Sabinus, "International Search Report" dated Feb. 24, 2021, issued in corresponding PCT Application No. PCT/US2020/059023, Filed Nov. 5, 2020.
Contreras, Sampayo, J., "International Search Report" dated Apr. 15, 2021, issued in corresponding PCT Application No. PCT/US2020/059028, Filed Nov. 5, 2020.
Kovacsovics, Martin, "International Search Report", dated Mar. 1, 2021, issued in corresponding PCT Application No. PCT/US2020/059036, Filed Nov. 5, 2020.

\* cited by examiner

CHANNEL SEGMENT FOR A TRACK OF A MOVER DEVICE

CROSS-REFERENCE TO RELATED APPLICATIONS

This application claims priority from U.S. Provisional Patent Applications having Ser. Nos. 62/931,935, 62/931,987, 62/932,013, 62/932,077, 62/932,113, all of which were filed on Nov. 7, 2019, and the entire contents of which are incorporated herein by reference; this application further claims priority from U.S. Provisional Patent Application having Ser. No. 62/945,978, filed on Dec. 10, 2019, the entire contents of which is incorporated herein by reference.

BACKGROUND

The constraints of a transportation system that seeks to promote high speed, high efficiency, and high-power density, impose challenges that are not present in the state of the art. In particular, such a transportation system may include a mover device and/or electromagnetic machine which is propelled along a track formed from channel segments which may be subjected to high changes in magnetic flux.

BRIEF DESCRIPTIONS OF THE DRAWINGS

For a better understanding of the various examples described herein and to show more clearly how they may be carried into effect, reference will now be made, by way of example only, to the accompanying drawings in which.

DETAILED DESCRIPTION

The constraints of a transportation system that seeks to promote high speed, high efficiency, and high-power density, impose challenges that are not present in the state of the art. In particular, such a transportation system may include a mover device and/or electromagnetic machine which is propelled along a track formed from channel segments which may be subjected to high changes in magnetic flux. In particular, the channel segments may be formed from laminations of ferromagnetic material, and the channel segments may magnetically conduct magnetic flux in two perpendicular directions to propel the mover along the track formed by the channel segments. As the laminations may be generally parallel to one of these directions, forces due to the changing magnetic flux in the other of these directions may cause the laminations to peel apart and/or slide part. While shear pins may be used to hold the laminations together (e.g. to prevent translational movement in a plane of the laminations, and at least partially in a direction perpendicular to the laminations), the shear pins may generally short the laminations and/or the shear pins may be electrically conducting; hence use of shear pins to hold the laminations together at regions of high magnetic flux change may be detrimental to the operation of the transportation system due to eddy currents which occur one or more of in and around the shear pins. Hence, it may be detrimental to use the shear pins in regions of high magnetic flux, and thus the shear pins may not address peeling of the laminations.

Hence, an aspect of the present specification provides a channel segment for a track of a mover device, the channel segment comprising: opposite ends joined by a body forming a magnetic flux pathway between the opposite ends, the magnetic flux pathway being one or more of C-shaped, U-shaped and horseshoe shaped between the opposite ends, the opposite ends forming respective transverse magnetic flux pathways about perpendicular to the magnetic flux pathway; laminations of ferromagnetic material forming the body, the laminations about parallel to the magnetic flux pathway and about perpendicular to the respective transverse magnetic flux pathways; shear pins through the laminations, the shear pins positioned to reduce eddy currents one or more of in and around the shear pins; and a retention mechanism at the opposite ends, the retention mechanism configured to transversely fasten the laminations together at the opposite ends while remaining insulated from each other.

Figure 1:
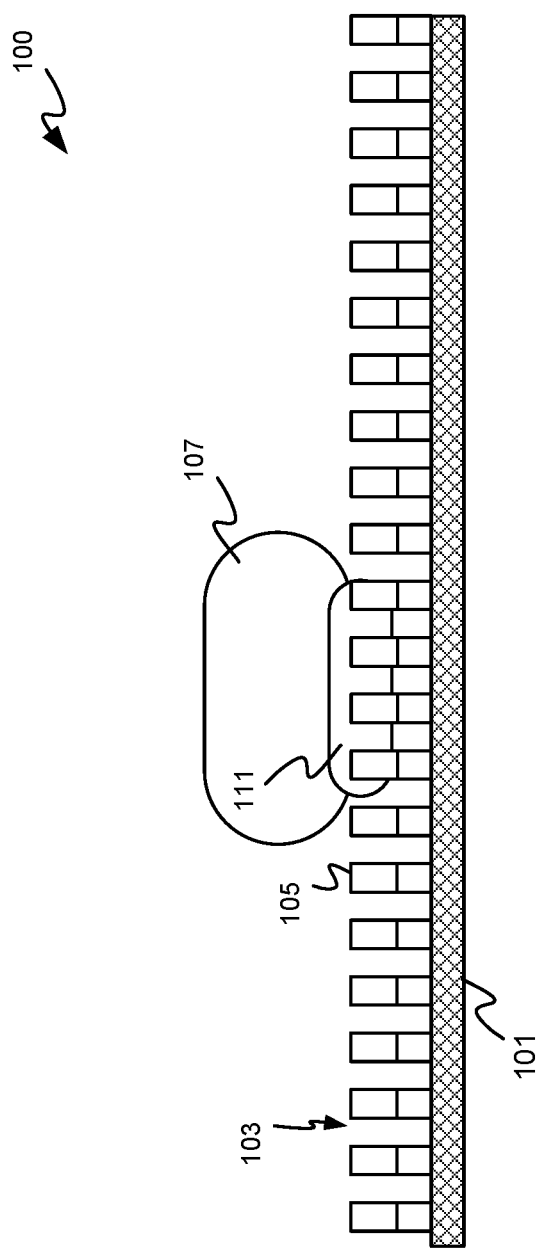
FIG. 1 depicts a view of a high-speed transport system that includes a track and channel segments, according to non-limiting examples.

Attention is directed to FIG. 1 which schematically depicts a view of a high-speed transport system 100. As depicted, the system 100 includes a fixed surface and/or a wall 101 (depicted in cross-section) which supports a track 103 comprising channel segments 105 spaced periodically along the wall 101. In some examples, the wall 101 may be a wall, and/or an interior of a tube, which may be evacuated and/or at least partially evacuated using vacuum pumps (not depicted) and the like, to form in a low-pressure environment. However, in other examples the tube may not be evacuated and/or the wall 101, the track 103 and the mover device 111 are not in a low-pressure environment. Furthermore, the wall 101 may not be a wall of tube, but may be a wall of any suitable structure and/or fixed surface which supports the track 103. The wall 101 may further comprise corners to which the channel segments 105 may be mounted. Furthermore, the high-speed transport system 100 may be deployed on land, underground, overland, overwater, underwater, and the like.

As depicted, the system 100 includes a payload 107 which may comprise a vehicle, and the like, for transporting cargo and/or passengers, and the like, and/or any other suitable payloads. The payload 107 may be aerodynamically shaped. The system 100 further includes at least one mover device 111 attached to the payload 107 which interact with the channel segments 105 to move the payload 107 along the track 103. Any suitable number of mover devices 111 may be attached to the payload 107 in any suitable configuration.

Similarly, the track 103 and the channel segments 105 may be located on one or more sides of a tube, and the like, that include the wall 101, with any geometry of a mover device 111 attached to the payload 107 adjusted accordingly.

In general, the channel segments 105 and the mover device 111, respectively form a stator and a rotor of a homopolar linear synchronous machine. A rotor (e.g. the mover device 111) may be substantially attached to the payload 107. The rotor/mover device 111 may be attached to the payload 107 in any of one or more orientations, such as on the top, bottom, and side of the payload 107, so long as a corresponding stator/channel segment 105 is substantially connected to the wall 101 in an orientation that allows the rotor/mover device 111 to pass through a channel segment 105 in a direction of motion. The stator/channel segments 105 may be attached to the wall 101 in any suitable orientation, so long as the rotor/mover device 111 have a substantially matching orientation to allow the rotor/mover device 111 to pass through the stator/channel segments 105.

While not depicted, the system 100 may further comprise a suspension and/or location system to suspend and/or locate the mover device 111 relative to the channel segments 105. Such a suspension and/or location system may be mechanical (e.g. wheels and a corresponding track therefor), and/or electromagnetic (e.g. a maglev system), and/or of any other suitable configuration. While not depicted, the system 100 may further comprise a guidance system to guide and/or steer the payload 107 relative to the track 103 and/or the channel segments 105, and/or onto other walls (e.g. of other tubes) that connect to the wall 101

Figure 2:
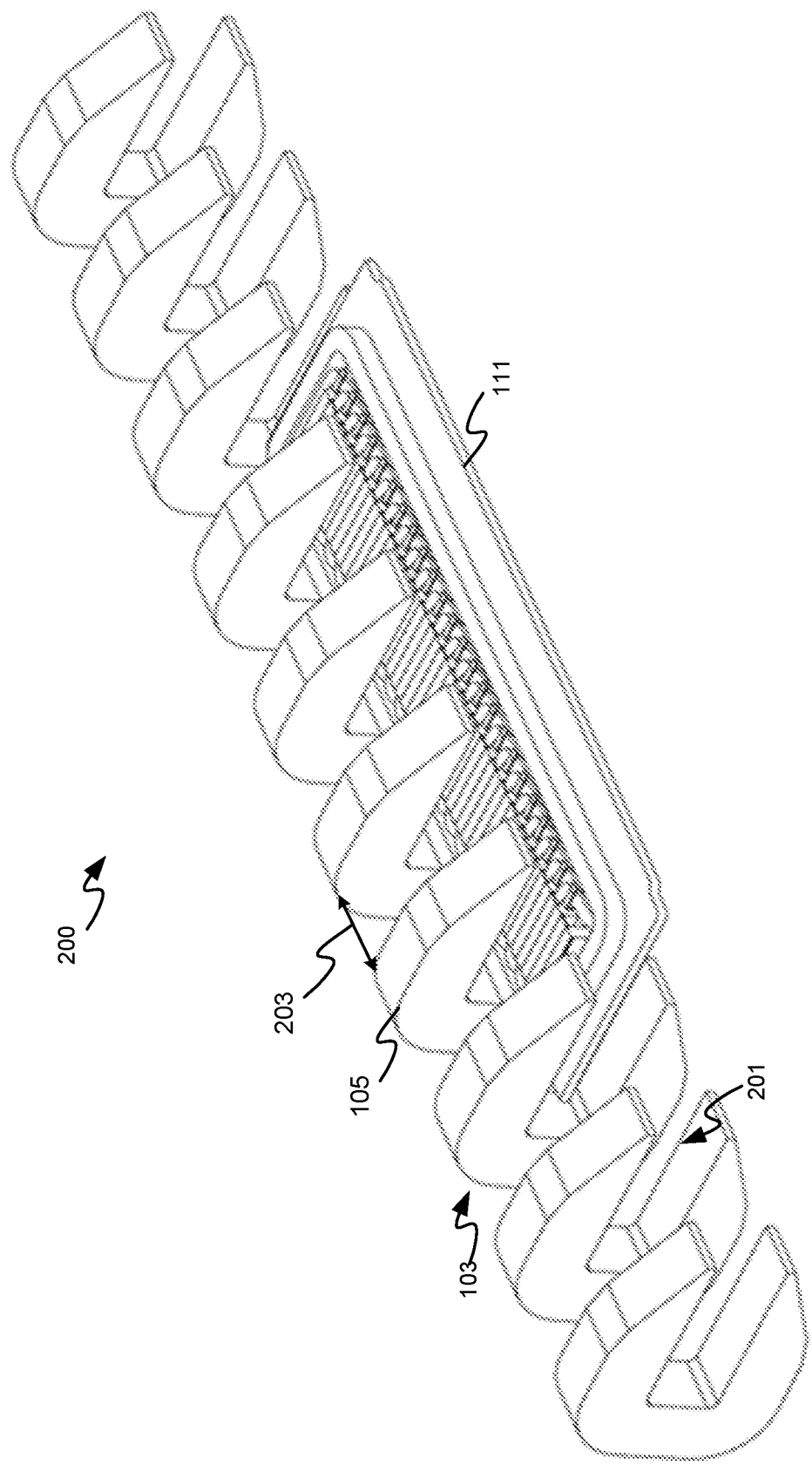
FIG. 2 depicts a perspective view of a homopolar linear synchronous motor, according to non-limiting examples.

Attention is next directed to FIG. 2 which depicts a homopolar linear synchronous machine (HLSM) 200 according to present examples. In particular FIG. 2 depicts a perspective view of a portion of the track 103, including a portion of the channel segments 105 and a mover device 111. As depicted, the channel segments 105 may be substantially C-shaped and/or horseshoe shaped, and the like, such that a mover device 111 may pass through a center "hollow" portion 201 of a channel segment 105. Indeed, as depicted, the mover device 111 is passing through a plurality of channel segments 105. Indeed, the track 103, and specifically the channel segments 105, may function as a stator of the HLSM 200, and the mover device 111 may function as a rotor of the HLSM 200, such that, together, the track 103 (e.g. the channel segments 105) and the mover device 111 form the HLSM 200.

As depicted, a stator of the HLSM 200, as described herein, may include two or more laterally offset channel segments 105, such that there is a gap 203 between adjacent channel segment 105. Hence, the channel segments 105 are generally magnetically salient, such that a varying magnetic flux may be produced across the channel segments 105 and the gaps 203, for example by at least one field coil of the mover device 111; such magnetic flux may be about constant in a channel segment 105, and the resulting magnetic flux in the gap 203 varies, relative to the flux in a channel segment 105, in a direction of motion (e.g. along the track 103). Armature coils of the mover device 111 may generate a second magnetic flux through the channel segment 105 that results in pole pairs (e.g. a sequence of magnetically-polarized regions) which interact with the magnetic flux, generated by the field coils, to propel the mover device 111 along the track 103.

In particular, the channel segments 105 are arranged such that hollow portions 201 of the channel segments 105 form a substantially continuous path for a rotor, and specifically the mover device 111, to move relative to the channel segments 105 and/or the track 103. Hence, a stator and/or track 103 and/or channel segments 105, may be substantially fixed relative to the rotor/mover device 111 of the HLSM 200. Indeed, together, the track 103 and the mover device 111 comprise a propulsion system for moving the payload 107 relative to the wall 101, in either direction along the track 103. In particular, the mover device 111 is propelled along the track 103 using magnetic flux produced by the mover device 111, as described, for example, in Applicant's co-pending application titled "HOMOPOLAR LINEAR SYNCHRONOUS MACHINE" having PCT Patent Application No. PCT/US2019/051701, filed Sep. 18, 2019, and which claims priority from U.S. Patent Application No. 62/733,551, filed Sep. 19, 2018, and the contents of each are incorporated herein by reference.

Figure 3:
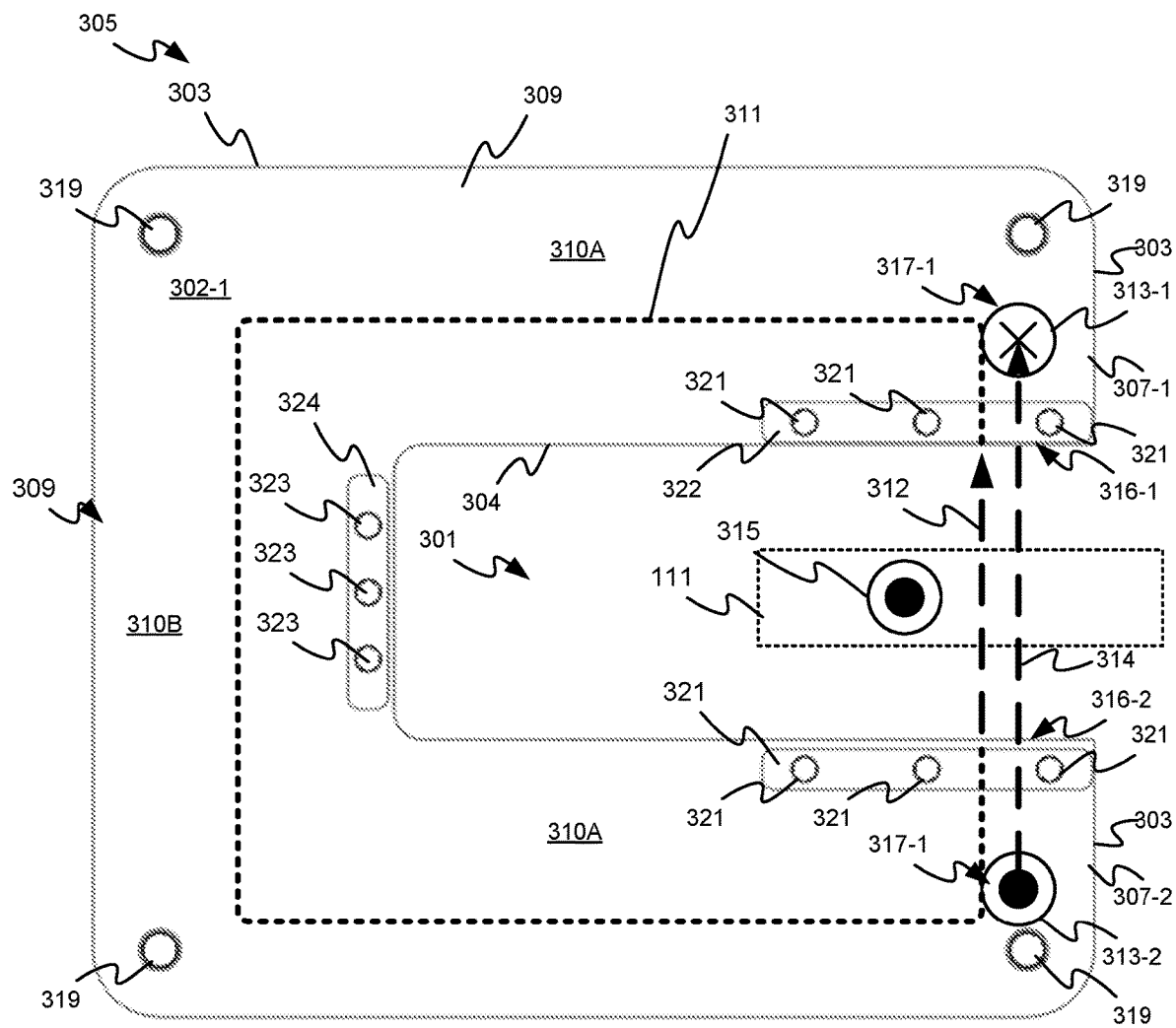
FIG. 3 depicts a side view of a channel segment which may be used to form a track of a high-speed transport system, according to non-limiting examples.
Figure 4A:
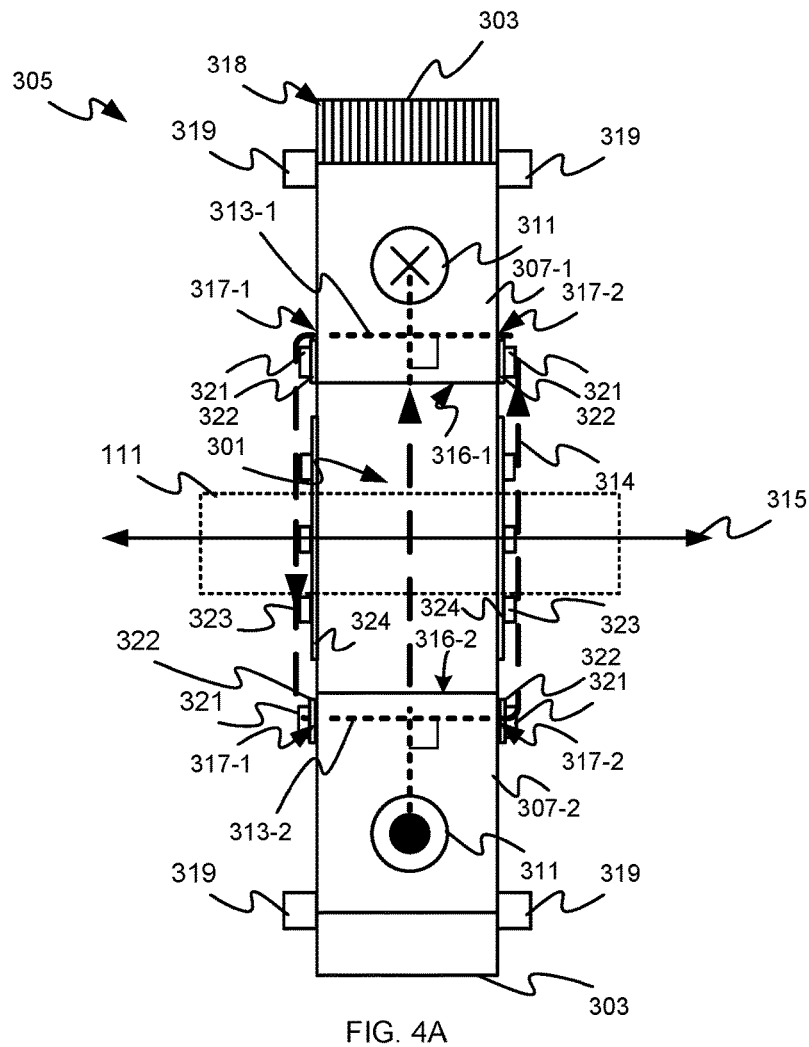
FIG. 4A depicts a front-end view of the channel segment of FIG. 3, according to non-limiting examples.

Attention is next directed to FIG. 3 and FIG. 4A which respectively depict a side view, and a front view of the mover device 111 in a hollow portion 301 of an example channel segment 305 that may be used to form the track 103. While the channel segment 305 has a different physical shape than the channel segment 105 (e.g. the channel segment 105 is chamfered), each of the channel segments 105, 305 may be otherwise constructed in a similar manner, as described hereafter. FIG. 3 and FIG. 4A further schematically depict the mover device 111 in outline in the hollow portion 301 to indicate a relative position of the mover device 111 when in operation with the channel segment 305, as well as magnetic flux pathways of the channel segment 305 along which magnetic flux generated by the mover device 111 flows to propel the mover device 111.

Figure 5:
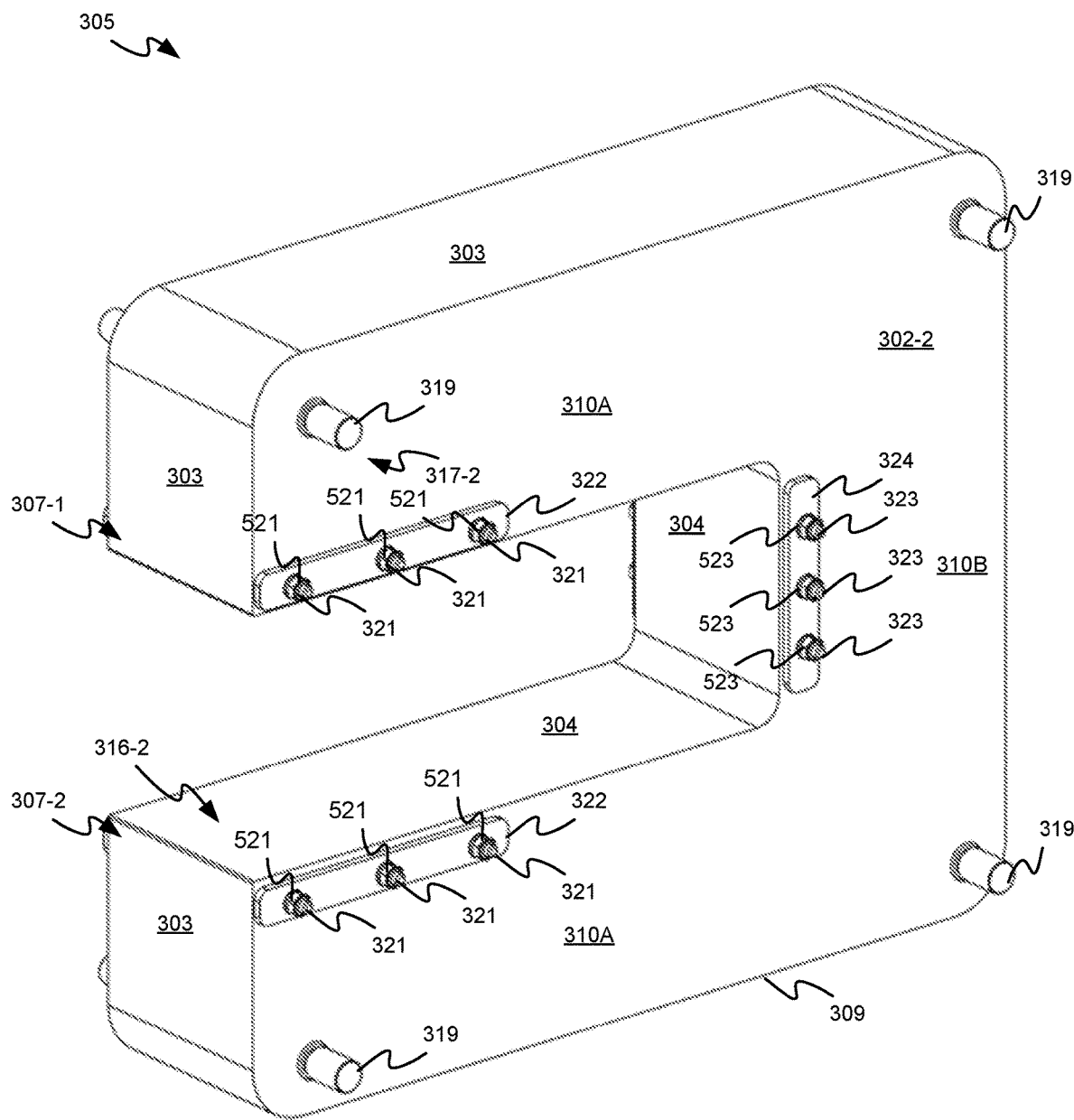
FIG. 5 depicts a perspective view of the channel segment of FIG. 3, from a side opposite that of FIG. 3, according to non-limiting examples.

The following discussion will also be made with reference to FIG. 5 which depicts a perspective view of the channel segment 305, from a side opposite that of FIG. 3, but without the mover device 111 and the magnetic flux pathways. For example, FIG. 3 shows a first side and/or first external surface 302-1 of the channel segment 305, and FIG. 5 shows a second side and/or second external surface 302-2 of the channel segment 305, opposite the first external surface 302-1. Hence, the external surfaces 302-1, 302-1 may interchangeably referred to hereafter, collectively, as the external surfaces 302 and, generically, as an external surface 302. Furthermore, the external surfaces 302 are joined by respective external sides 303, and respective internal sides 304 (e.g. which form the hollow portion 301).

The channel segment 305 generally comprises opposite ends 307-1, 307-2 joined by a body 309. As depicted, the body 309 comprises a pair of generally parallel arms 310A which extend from a joining portion 310B to form the hollow portion 301. For example, the arms 310A may be located at a top and bottom of the channel segment 305 (and/or the body 309), the joining portion 310B may be located at a rear of the channel segment 305 (and/or the body 309), with the hollow portion 301 opening at a front of the channel segment 305 (and/or the body 309). While the terms "top", "bottom", "front" and "rear", and the like, are used herein for convenience, the channel segment 305 may be provided, and/or mounted to a fixed surface, in any suitable position and hence the terms "top", "bottom", "front" and "rear", and the like are not meant to imply a mounted position of the channel segment 305.

The body 309 generally forms a magnetic flux pathway 311 (e.g. along which magnetic flux 312 generated by field coils of the mover device 111 flows) between the opposite ends 307-1, 307-2, the magnetic flux pathway 311 being one or more of C-shaped, U-shaped and horseshoe shaped between the opposite ends 307-1, 307-2. Similarly, as depicted, the channel segment 305 and/or the body 309 is one or more of C-shaped, U-shaped and horseshoe shaped between the opposite ends 307-1, 307-2. Hence, for example, the body 309 may comprise the hollow portion 301, between the opposite ends 307-1, 307-2, through which the mover device 111 may transversely move. However, the body 309 may have any suitable shape.

Furthermore, the opposite ends 307-1, 307-2 form respective transverse magnetic flux pathways 313-1, 313-2 about perpendicular to the magnetic flux pathway 311 (as best seen in FIG. 4A) (e.g. along which magnetic flux 314 generated by armature coils of the mover device 111 flows). The opposite ends 307-1, 307-2 are interchangeably referred to hereafter, collectively, as ends 307, and generically as an end 307; similarly, the transverse magnetic flux pathways 313-1, 313-2 are interchangeably referred to hereafter, collectively, as transverse magnetic flux pathways 313, and generically as a transverse magnetic flux pathway 313.

In FIG. 3 and FIG. 4A, the pathways 311, 313 and magnetic flux 312, 314 are indicated by lines of different formats. Furthermore, while the magnetic flux 312, 314 is depicted as being external to the channel segment 305, it is understood that, in operation, the magnetic flux 312, 314 flows along respective magnetic flux pathways 311, 313 of the channel segment 305. Furthermore, while the pathways 311, 313 are depicted as being lines, it is understood that the magnetic flux 312, 314 generally flows along the pathways 311, 313, in a three-dimensional manner (e.g. the magnetic flux 312, 314 will have a three-dimensional shape, but generally flows along the pathways 311, 313).

The mover device 111 generally moves about parallel to the magnetic flux pathways 313, hence the magnetic flux pathways 313 may be about parallel to a direction of motion of the mover device 111.

Put another way, the channel segment 305 may comprise a movement axis 315, the movement axis 315 comprising an axis in which movement of the mover device 111 may occur, relative to the channel segment 305, either in a "forward" or "backward" direction, for example along the track 103. The movement axis 315 may generally comprise a transverse axis of the channel segment 305 which is, for example, about perpendicular to the magnetic flux pathway 311 and about parallel to the transverse magnetic flux pathways 313. Put another way, the movement axis 315 may be perpendicular (e.g. normal) to opposing sides and/or external opposing surfaces 302 of the channel segment 305.

In particular, the magnetic flux pathway 311 begins and/or ends at opposing and/or opposite faces 316-1, 316-2 within the hollow portion 301 and adjacent to and/or perpendicular to external surfaces 303 of the opposite ends 307. The opposite faces 316-1, 316-2 are interchangeably referred to hereafter, collectively, as faces 316, and generically as a face 316.

Similarly, each of the magnetic flux pathways 313 begins and/or ends at respective opposing and/or opposite faces 317-1, 317-2 at respective sides and/or external surfaces 302 of the channel segment 305 about parallel to the magnetic flux pathway 311 and/or about perpendicular to the movement axis 315 and/or the direction of motion of the mover device 111. The opposite faces 317-1, 317-2 are interchangeably referred to hereafter, collectively, as faces 317, and generically as a face 317. The faces 317 are further about perpendicular to the faces 316.

Figure 4B:
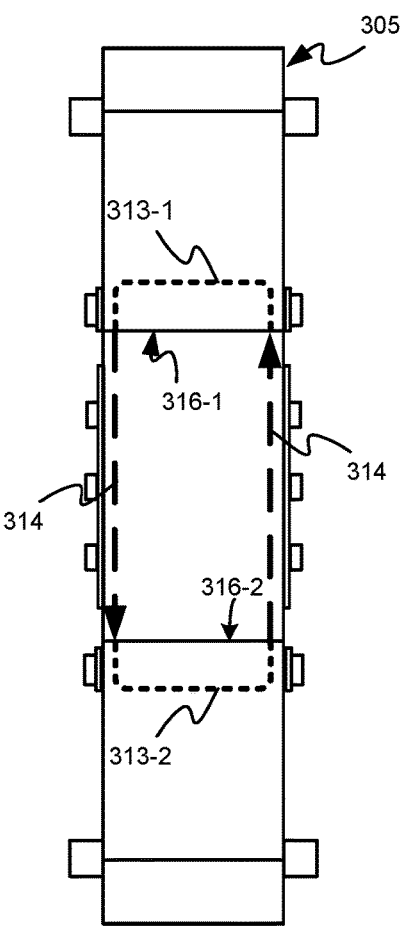
FIG. 4B depicts a front-end view of the channel segment of FIG. 3 and alternative transverse magnetic flux pathways, according to non-limiting examples

However, with brief reference to FIG. 4B, which is substantially similar to FIG. 4B but without components of the channel segment 305 numbered (e.g. for simplicity), the magnetic flux pathways 313 may alternatively begin and/or end at respective opposing and/or opposite faces 316-1, 316-2. Indeed, the magnetic flux pathways 313 may generally be three-dimensional and may begin and/or end at one or more sets of respective opposing and/or opposite faces 316, 317.

However, the respective transverse magnetic flux pathways 313 may at least partially extend between the respective opposite faces 317 though the transverse magnetic flux pathways 313 may begin and/or end at one or more of the faces 316, 317.

Indeed, put another way, the channel segment 305 may comprise: the body 309, which forms the hollow section 301; the opposite faces 316, in the hollow section 301, joined by the body 309, the body 309 forming the magnetic flux pathway 311 between the opposite faces 316, the magnetic flux pathway 311 being one or more of C-shaped, U-shaped and horseshoe shaped between the opposite faces 316; and respective opposite faces 317 between which the respective transverse magnetic flux pathways 313 at least partially extend, the respective opposite faces 317 on sides/ or external surfaces 302 of the body 309 about parallel to the magnetic flux pathway 311 and perpendicular to the opposite faces 316 (and/or perpendicular to the movement axis 315 and/or the direction of motion of the mover device 111).

In general, the magnetic pathway 311 comprises a path of minimum reluctance between the faces 316, and the respective transverse magnetic pathways 313 comprise respective paths of minimum reluctance between the faces 317 (and/or between opposite sides and/or external surfaces 302 of the body 309, at the ends 307). Furthermore, the transverse magnetic pathways 313 are referred to herein as "transverse" as they extend from side-to-side, between the external surfaces 302 of the body 309, whereas the magnetic pathway 311 extends through a length of the body 309.

The channel segment 305 further comprises laminations 318 of ferromagnetic material forming the body 309. The laminations 318 may generally include an electrically insulating material and/or apparatus and/or the laminations 318 may undergo a process for providing electrical insulation therebetween. For example, resin, oxide layers (e.g. via bluing), surface roughness, and the like, may be provided at respective external surfaces of the laminations 318 such that, when the laminations 318 are assembled to form the body 309 the laminations 318 are electrically insulated from each other. Put another way, the laminations 318 may be electrically insulated from each other using any suitable process including, but not limited to adding resin, increasing surface roughness, oxidizing surfaces, and the like.

Details of a lamination 318 are described in further detail below with respect to FIG. 6 and FIG. 7. However, in FIG. 3, a single lamination 318 forming a visible side (and/or the external surface 302-1) of the channel segment 305 is depicted, while a portion of the laminations 318 are depicted schematically in FIG. 4A. As hence best seen in FIG. 4A, the laminations 318 are about parallel to the magnetic flux pathway 311 and about perpendicular to the respective transverse magnetic flux pathways 313. The mover device 111 generally moves about parallel to the magnetic flux pathways 313, hence the magnetic flux pathways 313 may be about parallel to the movement axis 315 and/or the direction of motion of the mover device 111; hence, put another way, the laminations 318 are about parallel to the magnetic flux pathway 311 and about perpendicular to the movement axis 315 and/or the direction of motion of the mover device 111.

As the laminations 318 are about parallel to the magnetic flux pathway 311, the laminations 318 may reduce eddy currents in the channel segment 305 as the magnetic flux 312 changes along the magnetic flux pathway 311, for example as the mover device 111 enters and/or leaves the channel segment 305.

As depicted, the channel segment 305 further comprises shear pins 319 through the laminations 318. The shear pins 319 are generally positioned to reduce eddy currents in the shear pins 319 (e.g. when made of ferromagnetic material) and/or the shear pins 319 are generally positioned to reduce eddy currents around the shear pins 319 (e.g. via the laminations 318 when the shear pins 319 cause electrical shorts in the laminations 318). Hence, put another way, the shear pins 319 are generally positioned to reduce eddy currents one or more of in and around the shear pins 319.

As depicted, the channel segment 305 comprises four shear pins 319 located at corners of the external surfaces 302 of the body 309. The shear pins 319 may generally comprise ferromagnetic material and/or electrically conducting material. The shear pins 319 generally extend through the laminations 318, and/or between opposite sides and/or external surfaces 302 of the channel segment 305. As will be described below, for example the laminations 318 may be provided with apertures at locations of the shear pins 319.

To assemble the laminations 318, the laminations 318 are aligned to align the apertures; the shear pins 319 are inserted through the apertures, using force and/or pressure and/or heat processes and/or cooling processes (heating the laminations 318 to expand the aperture for shear pin insertion, or cooling the shear pins 319 to reduce a diameter thereof for insertion into the apertures), and a fastener, and the like, may be used to hold a shear pin 319 in place in an aperture, and to compress the laminations 318 together. In some examples, the laminations 318 may be aligned, and heated, such that apertures thereof expand; shear pins 319 may be placed in the apertures when expanded/heated, and the laminations 318 may then cool such that the apertures contract around the shear pins 319; a similar process may be implemented by cooling the shear pins to contract a diameter thereof to insert through the apertures of the laminations 318. Such compression may cause the laminations 318 to short due to pressure on the electrically insulating material of the laminations 318 (e.g. the resin may abrade, and the like), though whether or not such shorting occurs and/or a degree of such shorting, may depend on the insulation of the laminations 318 and/or the process for inserting the shear pins 319 into the apertures.

In yet further examples, compressive force and/or radial compressive force, applied to the laminations by the shear pins 319, may adversely affect the electromagnetic properties of the channel segment 305, at least in a region of the shear pins 319. In some examples, the shear pins 319 may increase a stiffness of the channel segment 305. However, the shear pins 319 may have any suitable configuration. In yet further examples, the shear pins 319 may be threaded, at least at ends thereof, in order to interface with, and/or attach to, a bracket which may assist in retaining and/or holding the laminations 318 together and the like; such a threaded assembly (e.g. of a shear pin 319 and an attached bracket) may, however, result in an increased axial compressive force of the shear pins 319 on the laminations (e.g. in an axial direction of the shear pins 319 and/or in line with the shear pins 319). Such threading may also assist in retention of attachment devices (e.g. see FIG. 8 and FIG. 9) which may be used to attach the channel segment 305 to a wall, and the like.

Hence, the shear pins 319 may generally result in eddy currents occurring in the laminations 318, and/or in and/or around the shear pins 319, as the magnetic flux 312 changes along the magnetic flux pathway 311. As such, the shear pins 319 are positioned to minimize, therethrough, a magnetic flux 312 of the magnetic flux pathway 311. Similarly, the shear pins 319 may be positioned to minimize, therethrough, a magnetic flux 314 of the transverse magnetic flux pathways 313.

In particular, as depicted, the shear pins 319 may be positioned away from the magnetic flux pathway 311 to reduce the eddy currents one or more of in and around the shear pins 319 due to a changing magnetic flux 312 along the magnetic flux pathway 311. Put yet another way, the shear pins 319 may be positioned as far away from the magnetic flux pathway 311 as possible, while still maintaining sufficient pressure and/or force on the laminations 318 to hold the laminations 318 together. Hence, as depicted, the shear pins 319 are located at corners of the body 309.

As the laminations 318 are about parallel to the transverse magnetic flux pathways 313 and/or the movement axis 315 and/or the direction of motion of the mover device 111, eddy currents may be generated in the laminations 318 due to changes in the magnetic flux 314 along the transverse magnetic flux pathways 313 and/or the movement axis 315 and/or the direction of motion of the mover device 111. As such, the shear pins 319 are further positioned as far away from the transverse magnetic flux pathways 313 as possible and/or to minimize a magnetic flux 314, of the transverse magnetic flux pathways 313, therethrough, and/or away from the transverse magnetic flux pathways 313 to reduce the eddy currents one or more of in and around the shear pins 319 due to a changing the magnetic flux 314 along the transverse magnetic flux pathways 313.

However, the magnetic flux 314 of the transverse magnetic flux pathways 313 generally results in perpendicular force on the laminations 318 (e.g. opposite a direction of motion of the mover device 111), which may cause the laminations 318 to peel apart and/or otherwise damage the laminations 318.

As such, the channel segment 305 further comprises fasteners 321 (e.g. bolts) through respective apertures at the opposite ends 307 and/or through the faces 317, the fasteners 321 about parallel to the respective transverse magnetic flux pathways 313 (and/or the direction of movement of the mover device 111), such that the laminations 318 are transversely fastened together at the opposite ends 307 (and/or at the faces 317) via the fasteners 321, and insulated from each other at the fasteners 321. Put another way, the fasteners 321 are positioned at regions of the transverse magnetic flux pathways 313 and/or at the faces 317. In general, the fasteners 321 may apply less compression on the laminations 318 to reduce the chance of shorting between the laminations 318, while also providing sufficient mechanical support to hold the laminations 318 together in the presence of changing magnetic flux 314 along the transverse magnetic flux pathways 313.

As will be described below, for example the laminations 318 may be provided with apertures at locations of the fasteners 321 and, when the laminations 318 are assembled using the shear pins 319, the apertures for the fasteners 321 are aligned to form an aperture, and/or a bolt aperture, in the body 309. A fastener 321 may be inserted through a respective aperture and fastened relative to the laminations 318 using a respective nut, and the like (e.g. see FIG. 5). However, the term fastener 321 is not unduly limiting and may include a bolt and nut pair, and/or any suitable fastener configured to transversely fasten the laminations 318 together without shorting the laminations 318. Such fasteners 321 may include bolts, rivets, plastic clamps, overmolding a region outside of the magnetic flux (e.g. using plastic, resin, and the like), linking channel segments 305 (e.g. on the track 103) using non-ferromagnetic/non-electrically conducting material (e.g. at the locations of the fasteners 321), and/or any suitable fastener. However, such fasteners may apply less compressive force to the laminations 318 than the shear pins 319.

Indeed, more generally, the channel segment 305 generally comprises a retention mechanism at the opposite ends 307, the retention mechanism configured to transversely fasten the laminations 318 together at the opposite ends while remaining insulated from each other. In general, the retention mechanism applies less compressive force (e.g. transverse force) to the laminations 318 than the shear pins 319. Put another way, the retention mechanism may minimize compressive force at the opposite ends (e.g. when no magnetic flux is in the channel segment 305), but generally prevents the laminations 318 from peeling due to magnetic flux in the channel segment 305 when the channel segment 305 is in operation.

In some examples, while not depicted, the channel segment 105 may further comprise electrically insulating material positioned to electrically insulate the fasteners 321 from the laminations 318. For example, an electrically insulating bushing, and/or a bolt sleeve, and the like, may be provided in a bolt aperture prior to a fastener 321 being inserted into the bolt aperture. Alternatively, a fastener 321 may be at least partially coated with electrically insulating material, such a resin, and the like.

Any suitable number of fasteners 321 may be used at the opposite ends 307 and/or at the faces 317. For example, as depicted in FIG. 3, three fasteners 321 are used at each of the opposite ends 307 and/or at the faces 317. However any suitable number of fasteners 321 is within the scope of the present specification including, but not limited to, as few as one fastener 321, or two bolts, at each of the opposite ends 307 and/or at the faces 317, or more than three fasteners 321. Hence, in some examples, the channel segment 305 may comprise respective pluralities of the fasteners 321, through the opposite ends 307 and/or through the faces 317, however the channel segment 305 may comprise one respective fastener 321 through each of the opposite ends 307 and/or through the faces 317.

Indeed, as depicted, the channel segment 305 further comprises respective plates 322 held in place along the faces 317 and/or the external surfaces 302 at the opposite ends 307 by the fasteners 321. For example, as depicted a respective plate 322 comprises apertures for each of respective fasteners 321 (e.g. three apertures for three fasteners 321), and the apertures of the plates 322 are generally positioned to align with the bolt apertures of the body 309. Furthermore, as depicted, the channel segment 305 is provided with a plate 322 at each of the faces 317. Hence, the fasteners 321 are inserted through apertures of the plates 322 when attaching the fasteners 321 to the body 309, which results in the plates 322 being along the faces 317 and/or the external surfaces 302 at the opposite ends 307. In general, the plates 322 distribute pressure from the heads and the nuts of the fasteners 321 along the faces 317 to assist in fastening the laminations 318 together at the faces 317 and/or at the opposite ends 307. In some examples, the fasteners 321 may be electrically insulated from the plates 322 and/or the plates 322 may be electrically insulated from the laminations 318.

In particular, as depicted, the channel segment 305 may comprise: respective pluralities of the fasteners 321 through each of the opposite ends 307; and a respective pair of plates 322 held in place along opposite external surfaces 302 (e.g. at the opposite ends 307) and/or along opposing faces 317, by the respective pluralities of the fasteners 321. In particular the plates 322 may be provided in pairs, for example a pair of plates 322 for each set of fasteners 321 at a respective pair of opposing faces 317, with a plate 322 at each face 317 of each respective pair of opposing faces 317.

In some examples, the fasteners 321 may comprise ferromagnetic bolts, electrically conducting bolts, and the like (e.g. the fasteners 321 may comprise one or more of a ferromagnetic material, an electrically conducting material and the like). However the fasteners 321 may comprise a non-ferromagnetic material and/or an electrically insulating material. Hence, the fasteners 321 may comprise a non-ferromagnetic material, however the fasteners 321 may comprise a ferromagnetic material. The fasteners 321 may hence comprise any suitable material that combines strength with suitable electrical and/or magnetic properties to fasten the laminations 318 together without shorting the laminations 318 and which may reduce and/or minimize eddy currents in the fasteners 321.

As best seen in FIG. 3, and FIG. 5, the channel segment 305 may further comprise one or more respective fasteners 323 (e.g. bolts) through the body 309 around the hollow portion 301. For example, as depicted, the channel segment 305 may comprise one or more fasteners 323 through a rear section of the body 309 (e.g. through the joining portion 310B), adjacent the hollow portion 301, along with respective plates 324 along the external surfaces 302-2, to assist with fastening the laminations 318 together in regions of the body 309 away from the shear pins 319. The fasteners 323 and the plates 324 may be assembled at the channel segment 305 in a manner similar to the fasteners 321 and the plate 322.

With brief attention to FIG. 5, respective nuts 521, 523 of the fasteners 321, 323 are depicted at the external surface 302-2, adjacent a respective plate 322, 324

Figure 6:
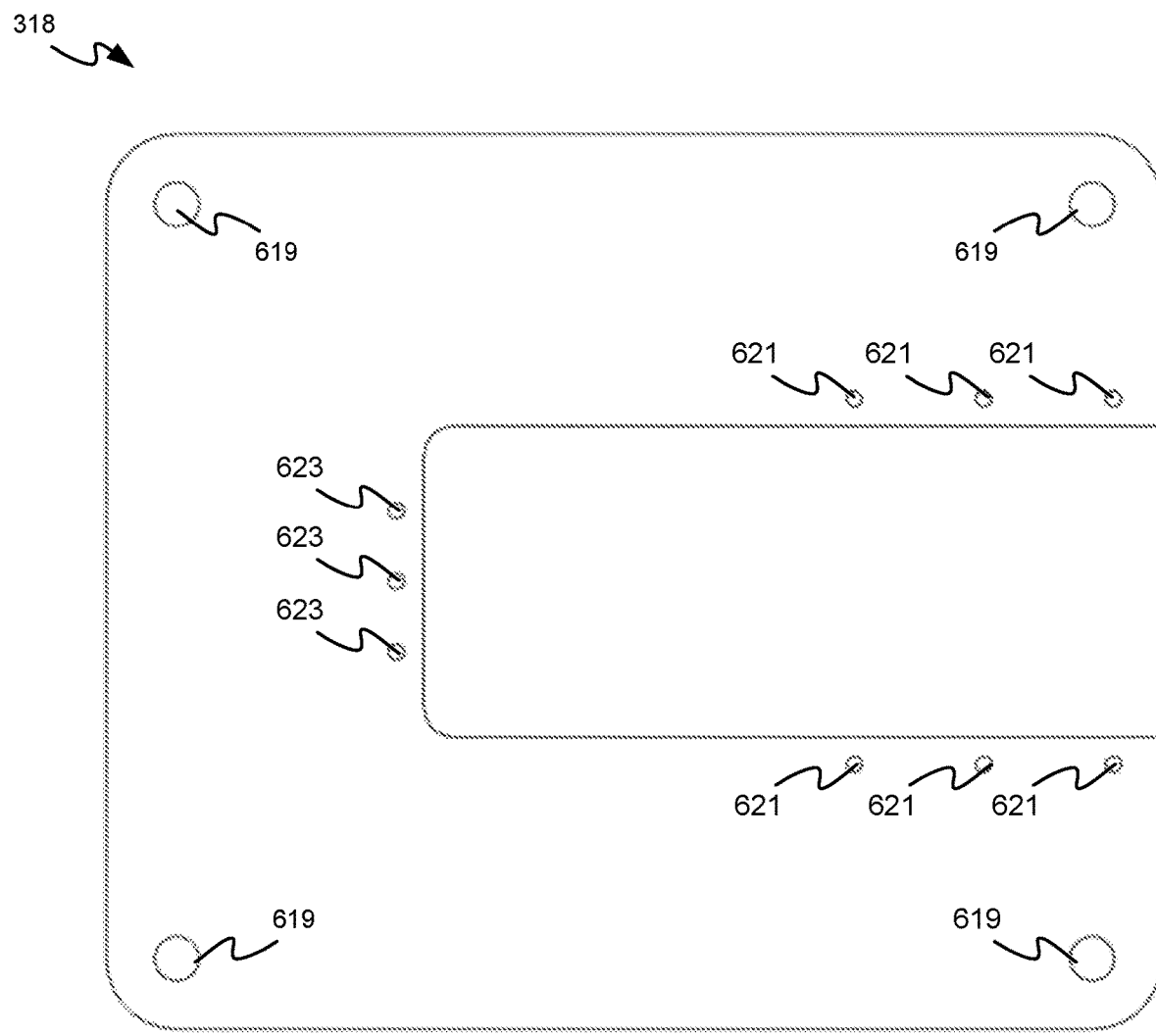
FIG. 6 depicts a side view of a lamination which may be used to form the channel segment of FIG. 3, according to non-limiting examples.
Figure 7:
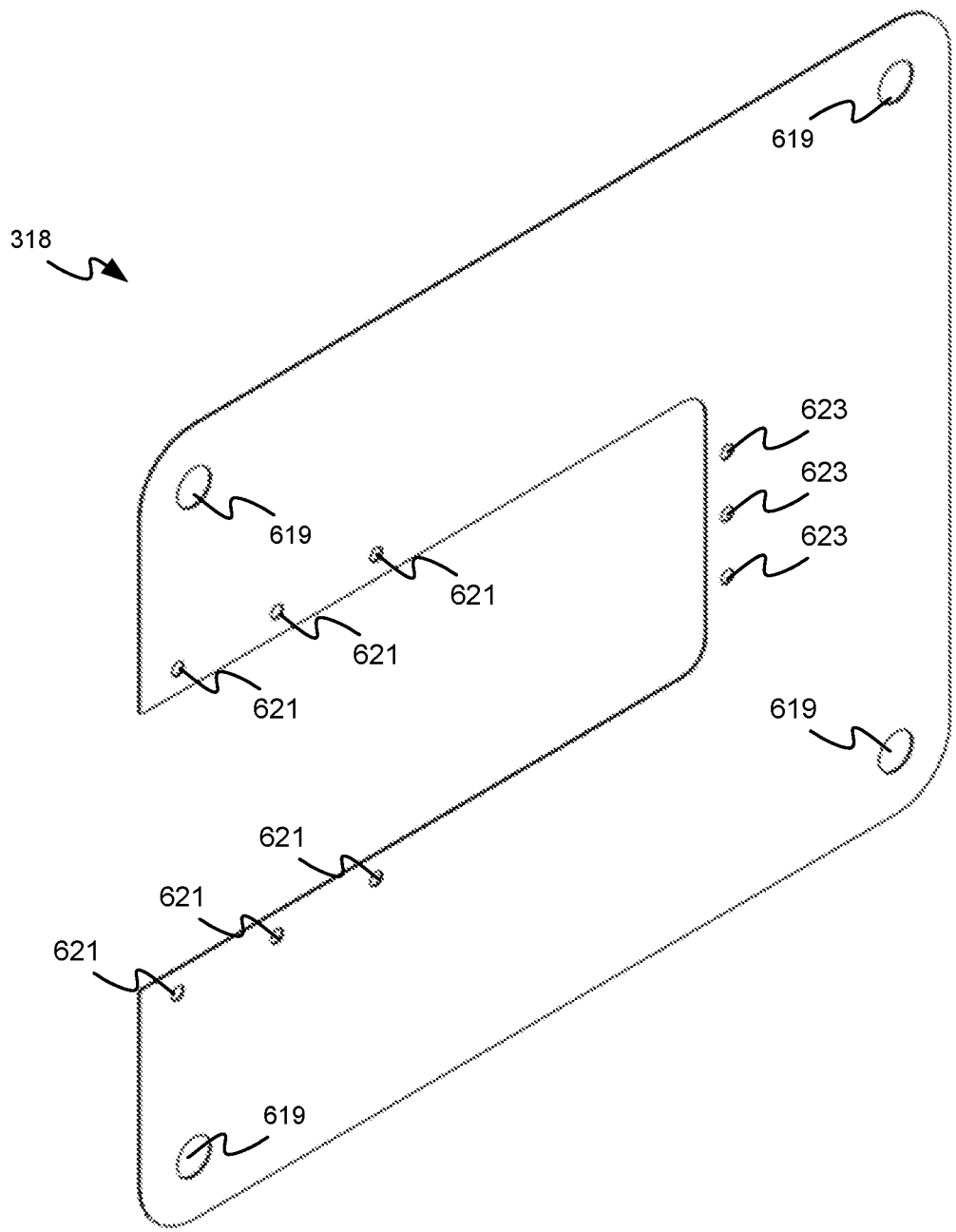
FIG. 7 depicts a perspective view of the lamination of FIG. 6, from a side opposite to that of FIG. 6, according to non-limiting examples.

Attention is next directed to FIG. 6 and FIG. 7 which respectively depict a side view and a perspective view of an example lamination 318. FIG. 7 depicts the lamination 318 from a side opposite that of FIG. 6. In particular, FIG. 6 and FIG. 7 depict apertures 619, 621, 623 through the lamination 318 which respectively correspond to positions of the shear pins 319, the fasteners 321 and the fasteners 323. Furthermore, it is understood from FIG. 6 and FIG. 7 that the lamination 318 has a shape of an external surface 302 of the body 309 and/or a shape of a cross-section of the body 309 through a direction of the magnetic flux pathway 311. Hence, as described above, a plurality of the laminations 318 may be aligned such that the respective apertures 619, 621, 623 of the laminations 318 align. Shear pins 319 may be inserted through the apertures 619 and used to compress the laminations 318 together to provide apertures through the body 309 formed by the apertures 621, 623, through which the respective fasteners 321, 323 may be inserted. Hence, the apertures 619 may have a larger diameter than the apertures 621, 623 as the shear pins 319 may have a larger diameter than the fasteners 321, 323.

Figure 8:
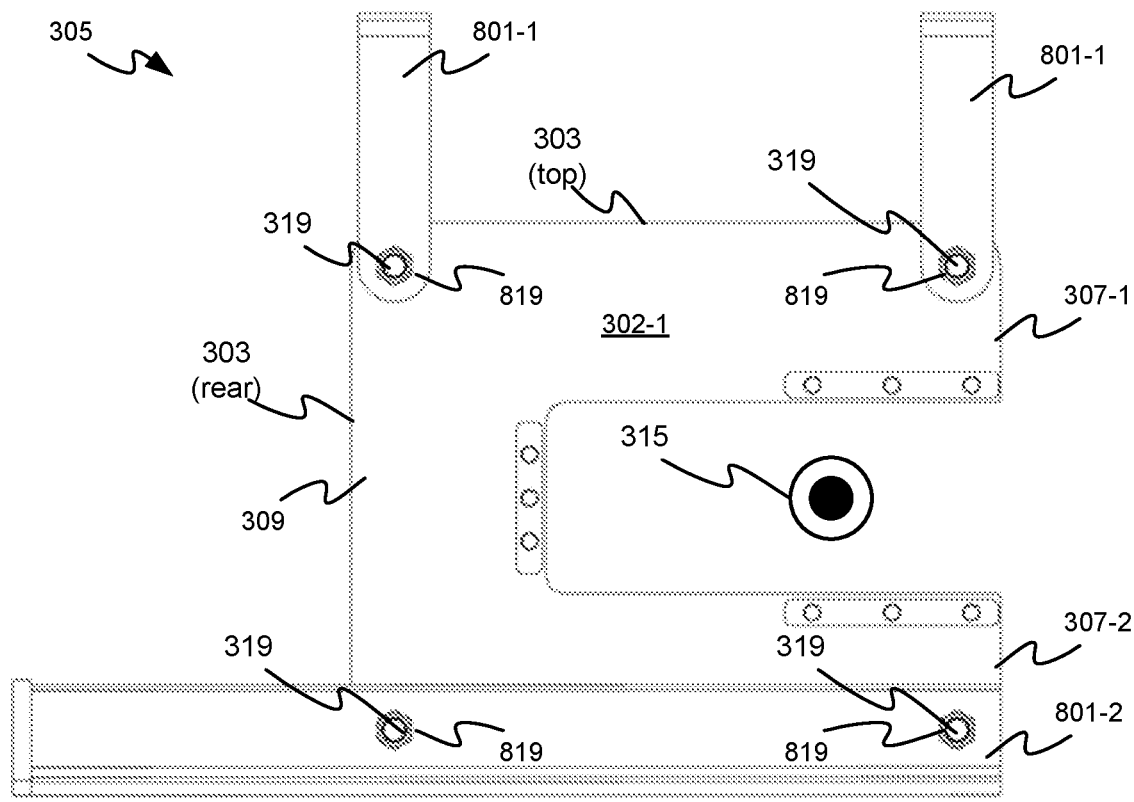
FIG. 8 depicts a side view of the channel segment of FIG. 3 adapted for attachment to a fixed surface, according to non-limiting examples.
Figure 9:
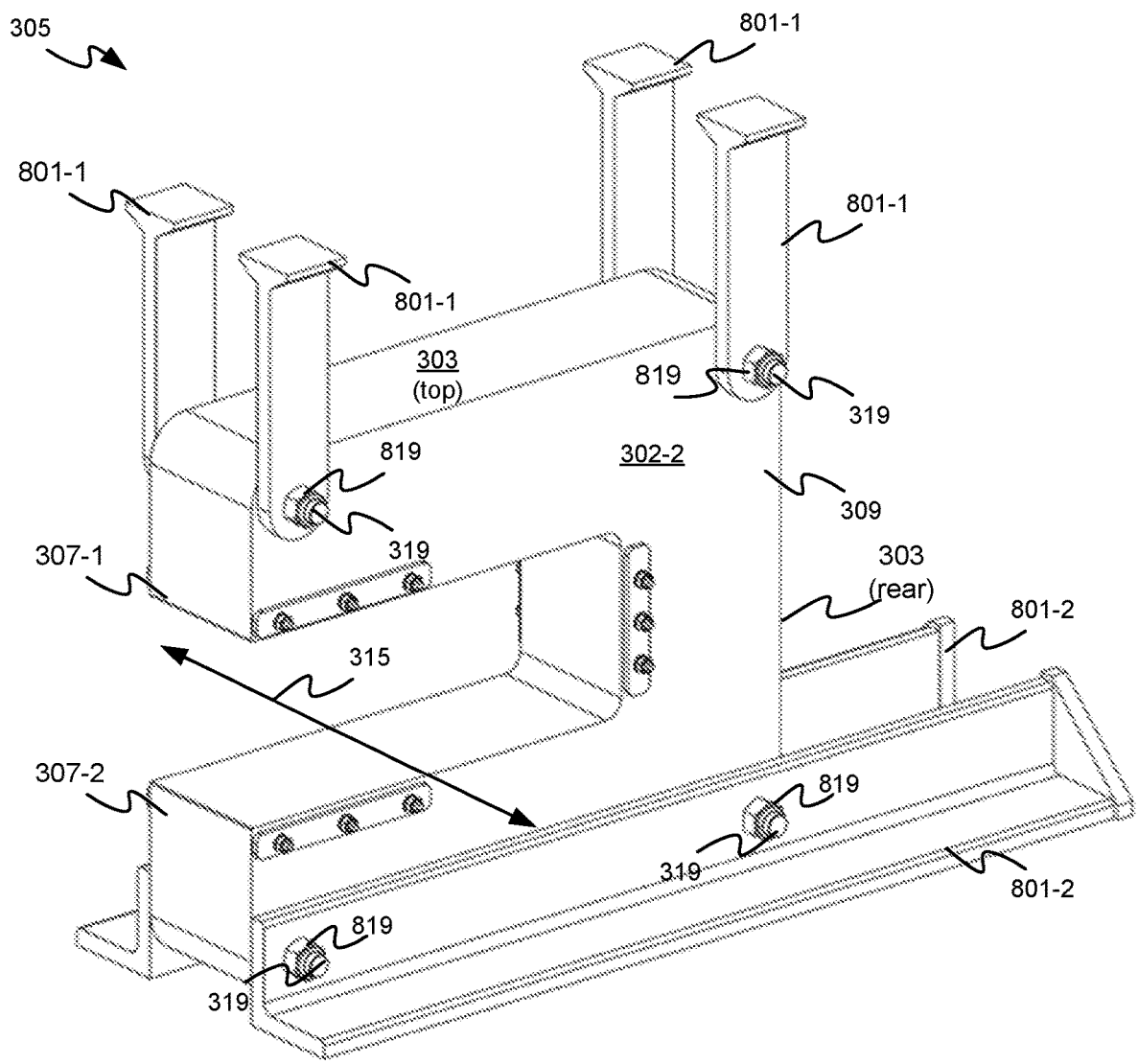
FIG. 9 depicts a perspective view of the channel segment of FIG. 8, from a side opposite that of FIG. 8, according to non-limiting examples.

Attention is next directed to FIG. 8 and FIG. 9 which respectively depict a side view and a perspective view of the channel segment 305 adapted for attachment to the wall 101 and the like. FIG. 9 depicts the channel segment from a side opposite that of FIG. 8. In particular, as depicted, the channel segment 305 comprises one or more attachment devices 801-1, 801-2, extending from the shear pins 319, the one or more attachment devices 801-1, 801-2 configured to attach the body 309 to one or more of a fixed surface, a wall and an interior of a tube (e.g. such as the wall 101, and the like).

The attachment devices 801-1, 801-2 are interchangeably referred to hereafter, collectively, as the attachment devices 801 and, generically, as an attachment device 801.

As depicted, the shear pins 319 are adapted to include threaded ends to which nuts 819 may be attached to attach a respective attachment device 801 thereto. For example, each attachment device 801 may comprise a bracket (e.g. an angle bracket) which extends from the body 309 to attach the channel segment 305 to a fixed surface; each attachment device 801 may include respective apertures through which may be placed over one or more of the shear pins 319 with threaded ends until the one or more of the shear pins 319 extend therethrough. The nuts 819 may be attached to the threaded ends of the shear pins 319 to affix an attachment device 801 to the body 309. As depicted, the attachment devices 801-1 are configured to be attached to one shear pin 319, and the attachment devices 801-2 are configured to be attached to two shear pins 319.

As depicted, the attachment devices 801-1 are configured to extend perpendicular to the movement axis 315, for example in an "upward" direction, and past a top external side 303 of the channel segment 305, and the attachment devices 801-2 are configured to extend perpendicular to the movement axis 315, for example towards a rear external side 303 of the channel segment 305. Hence the attachment devices 801-1 are perpendicular to the attachment devices 801-2 and may be used to attach the channel segment 305 to a corner of the wall 101, and the like.

Furthermore, the attachment mechanisms 801 may comprise any suitable rigid material such that, when a plurality of the channel segments 305 are attached to the wall 101 to form the track 103, the attachment mechanisms 801 generally limits deflection of the channel segments 305 (e.g. along a movement direction of the mover device 111, as the mover device 111 passes therethrough). In general, lower deflection of the channel segments 305 may reduce energy consumption in an HLSM formed by the channel segments 305 and the mover device 111 (e.g. which may reduce work performed by the mover 111 on the track 103 formed by the channel segments 305), which may lead to higher efficiency in the system 100. Lower deflection may also increase structural durability and/or fatigue life of the track 103 formed by the channel segments 305.

Indeed, a plurality of the channel segments 305 may be attached to the wall 101 (e.g. of a tube) to provide saliency and/or a high degree of saliency therebetween; such saliency may depend on the degree of deflection of the channel segments 305.

Indeed, the channel segments 305 may be attached to the wall 101 using any suitable mechanism and/or combinations of mechanisms including, but not limited to, one or more of: flat irons, angle irons, rods, and the like; overmolding sets of channel segments 305 with non-magnetic, non-conductive material to form assemblies thereof, and attaching such assemblies to the wall 101; embedding channel segments 305 into the wall 101 (e.g. by casting in place at the wall 101); adding a truss structure to the channel segments 305 and/or to the wall 101 (e.g. which may include, but is not limited to, providing assemblies of channel segments 305 and attaching the assemblies to the wall 101); welding channel segments 305 to wall 101, and the like.

Further alternatives are within the scope of the present specification. For example, while the body 309 has rounded corners, the body 309 may be chamfered at external edges, similar to the channel segment 105, to one or more of: reduce weight of the body 309; and shape magnetic flux 312 along the magnetic flux pathway 311.

Further alternatives are within the scope of the present specification. For example, while the channel segment 305 is depicted throughout as having four shear pins 319, the channel segment 305 may comprise as few as two or three shear pins 319 (e.g. when the laminations 318 are bonded together), and/or more than four shear pins 319 and/or any suitable number of shear pins 319. For example, as depicted throughout the channel segment 305 includes four shear pins 319, one at each "corner" of an external surface 302. However, in other examples, two or three shear pins 319 may be provided, for example two at a rear side of the channel segment 305 (and optionally one shear pin 319 at a remaining position of the shear pins 319 depicted in FIG. 3). For example two shear pins 319 may be provided at rear corners and a shear pin 319 may be optionally provided at one front corner. In examples using two or three shear pins 319, the laminations 318 may further be bonded together using any suitable adhesive (e.g. an electrically insulating and/or non-conductive adhesive) to assist in fastening the laminations 318 together, and/or using a clad weld around an outside circumference of the channel segment 305. In yet further examples the channel segment 305 may be adapted to include a truss structure which may be welded and/or bolted to the channel segment 305 to assist with fastening the laminations 318 together.

Indeed, provided here is a channel segment for a track of a mover device that is compatible with a high speed track for a homopolar linear synchronous machine; is laminated to reduce eddy current loss; has low eddy current loss in other parts; and has high saliency in a direction of motion (in a track formed from a plurality of the channel segments). Further, a plurality of the channel segments may be rigidly attached to an interior wall of a tube to retain a high degree of magnetic saliency, have minimal effect on electromagnetic function of a homopolar linear synchronous machine (e.g. losses and force production); and provided with sufficient stiffness to limit deflection (to reduce loss and increase life of the channel segments and/or the track).

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that there are yet more alternative examples and modifications possible, and that the above examples are only illustrations of one or more examples. The scope, therefore, is only to be limited by the claims appended hereto.

What is claimed is:

1. A channel segment for a track of a mover device, the channel segment comprising:
   opposite ends joined by a body forming a magnetic flux pathway between the opposite ends, the magnetic flux pathway being one or more of C-shaped, U-shaped and horseshoe shaped between the opposite ends, the opposite ends forming respective transverse magnetic flux pathways about perpendicular to the magnetic flux pathway;
   laminations of ferromagnetic material forming the body, the laminations about parallel to the magnetic flux pathway and about perpendicular to the respective transverse magnetic flux pathways;
   shear pins through the laminations, the shear pins positioned to reduce eddy currents one or more of in and around the shear pins; and
   a retention mechanism at the opposite ends, the retention mechanism configured to transversely fasten the laminations together at the opposite ends while remaining insulated from each other, the retention mechanism having a different configuration than the shear pins.

2. The channel segment of claim 1, wherein the shear pins are positioned to minimize a magnetic flux, of the magnetic flux pathway, therethrough.

3. The channel segment of claim 1, wherein the shear pins are positioned away from the magnetic flux pathway to reduce the eddy currents one or more of in and around the shear pins due to a changing magnetic flux along the magnetic flux pathway.

4. The channel segment of claim 1, wherein the shear pins are positioned to maximize a respective distance between a given shear pin and the magnetic flux pathway.

5. The channel segment of claim 1, wherein the retention mechanism applies less compressive force to the laminations than the shear pins.

6. The channel segment of claim 1, wherein the retention mechanism minimizes a compressive force at the opposite ends.

7. The channel segment of claim 1, wherein the retention mechanism comprises fasteners through respective apertures at the opposite ends, the fasteners about parallel to the respective transverse magnetic flux pathways, such that the laminations are transversely fastened together at the opposite ends via the fasteners and insulated from each other at the fasteners.

8. The channel segment of claim 7, wherein the fasteners are electrically insulated from the laminations.

9. The channel segment of claim 7, further comprising:
   a respective plurality of the fasteners, through the opposite ends.

10. The channel segment of claim 7, further comprising:
    respective plates held in place along external surfaces at the opposite ends by the fasteners.

11. The channel segment of claim 7, further comprising:
    respective pluralities of the fasteners through each of the opposite ends; and
    a respective pair of plates held in place along opposite external surfaces of each of the opposite ends by the respective pluralities of the fasteners.

12. The channel segment of claim 7, wherein the fasteners comprise non-ferromagnetic material.

13. The channel segment of claim 7, wherein the fasteners comprise ferromagnetic material.

14. The channel segment of claim 1, wherein the body comprises a hollow portion, between the opposite ends, through which the mover device transversely moves.

15. The channel segment of claim 1, wherein the body comprises a hollow portion, between the opposite ends, through which the mover device transversely moves, and the channel segment further comprises one or more respective bolts through the body around the hollow portion.

16. The channel segment of claim 1, wherein the body is chamfered at external surfaces to one or more of:
    reduce weight; and
    shape magnetic flux along the magnetic flux path.

17. The channel segment of claim 1, further comprising one or more attachment devices extending from the shear pins, the one or more attachment devices configured to attach the body to one or more of a fixed surface, a wall and an interior of a tube.

* * * * *